(12) United States Patent
Hori

(10) Patent No.: US 6,255,134 B1
(45) Date of Patent: Jul. 3, 2001

(54) METHOD FOR MAKING HIGH-FRAME-RATE CCD IMAGING DEVICES FROM OTHERWISE ORDINARY AND INEXPENSIVE CCD DEVICES

(75) Inventor: Toshikazu Hori, Cupertino, CA (US)

(73) Assignee: Pulnix America, Inc., Sunnyvale, CA (US)

( * ) Notice: Subject to any disclaimer, the term of this patent is extended or adjusted under 35 U.S.C. 154(b) by 0 days.

(21) Appl. No.: 09/558,006

(22) Filed: Apr. 24, 2000

(51) Int. Cl.⁷ ...................................... H01L 21/00
(52) U.S. Cl. ................... 438/75; 438/60; 438/78; 257/215; 257/229
(58) Field of Search ........................ 257/229, 215, 257/222, 225, 231–234, 240–243; 438/60, 75, 78, 144–148

(56) References Cited

U.S. PATENT DOCUMENTS 4,364,973 * 12/1982 Koike et al. ....................... 427/75
5,438,414 * 8/1995 Rust ...................................... 356/364
5,572,251 * 11/1996 Ogawa ................................. 348/207
5,598,017 * 1/1997 Konuma ............................... 257/232

* cited by examiner

Primary Examiner—Charles Bowers
Assistant Examiner—Erik Kielin
(74) Attorney, Agent, or Firm—Thomas E. Schatzel; Law Offices of Thomas E. Schatzel, A Prof. Corp.

(57) ABSTRACT

A fast frame-rate CCD imaging device is produced by modifying the optical mask of an otherwise ordinary and inexpensive CCD integrated circuit to darken a majority of the active imaging photocells. The modified CCD integrated circuit is operated at near its maximum horizontal and vertical clock rates, but multiple image frames are newly defined within the one previous active photocell array field. The added dark areas in the optical mask act to protect all recent frames still in transit within the active array area from being double exposed and thus corrupted. The serial output of the thus-modified CCD device is reinterpreted to include more frames than originally at a multiple equal to the original array dimension divided by the new array dimension ($m \cdot n / m' \cdot n'$)

6 Claims, 3 Drawing Sheets

Optical black position

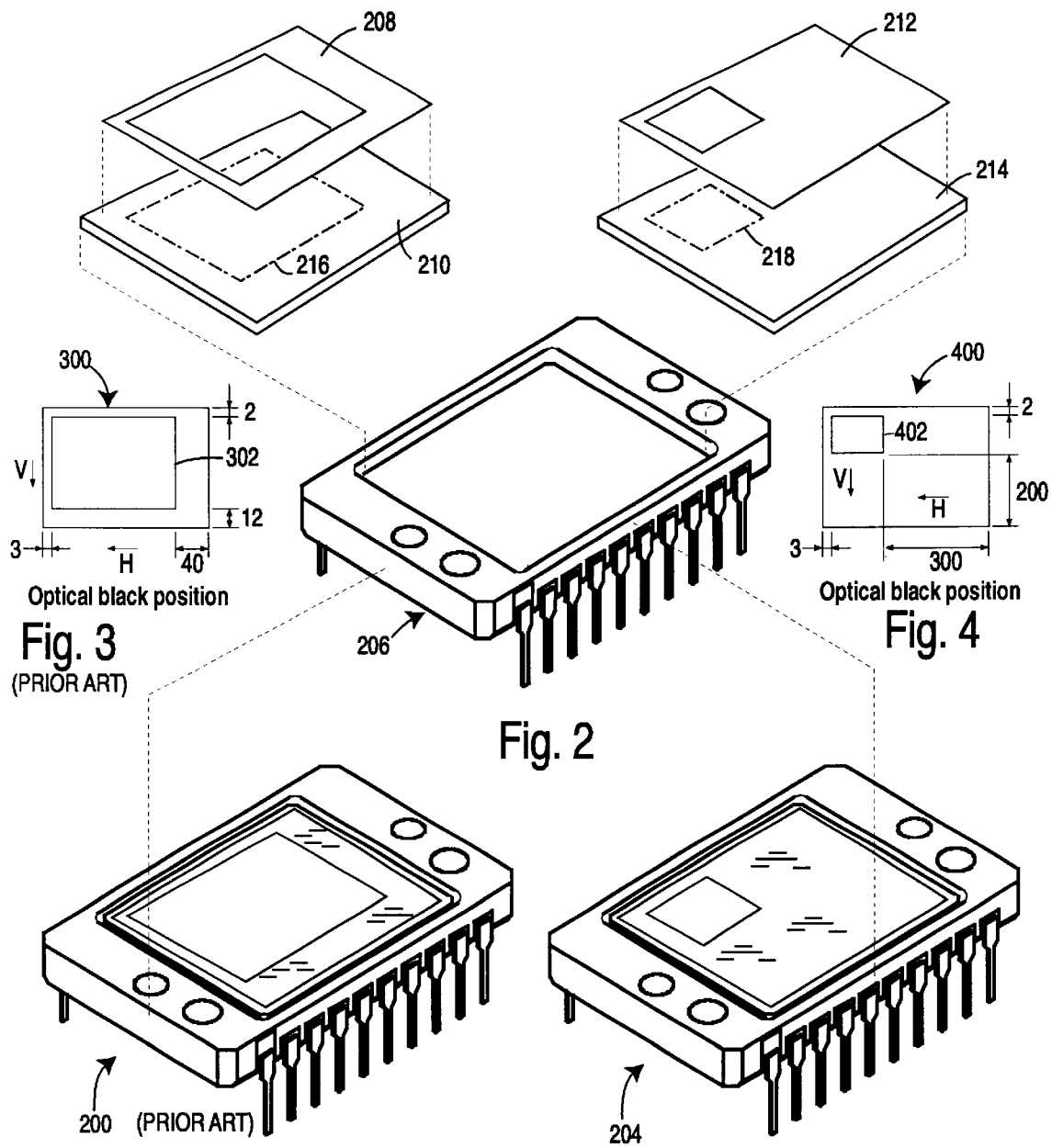

METHOD FOR MAKING HIGH-FRAME-RATE CCD IMAGING DEVICES FROM OTHERWISE ORDINARY AND INEXPENSIVE CCD DEVICES

1. FIELD OF THE INVENTION

The present invention relates to electronic imaging devices, and more particularly to semiconductor processing methods for producing varieties of otherwise ordinary and inexpensive CCD array devices that can operate faster than one hundred frames-per-second.

2. DESCRIPTION OF THE PRIOR ART

The typical charge-coupled device (CCD) array is a solid-state imager that features ruggedness, extraordinary sensitivity, excellent image quality, low power demand, and never wears out. The CCD imager evolved from a low-cost integrated circuit (IC) memory element that was developed in 1970. CCD's can shift analog charges held in one photocell (called pixel) to an adjacent photocell by applying a suitable shift pulse. The analog information can be shifted from photocell to photocell with practically no loss or other distortion. It was discovered that the basic CCD memory could be modified to include light sensitive elements.

In the basic CCD array the individual imaging photocells are arranged in a rectangular matrix, e.g., the 512-line NTSC system requires around 491 active scan lines or rows, each with nearly 300 to 1000 elements or pixels typically. Each picture element converts incoming light into an electrical charge on an FET transistor that is directly proportional to the amount of light received. Such charge is then clocked, or shifted, from photocell to photocell out of the array to be converted to a video signal that represents the original image. In industrial applications such as machine vision or robot vision, the analog signals are typically converted to digital word for storage, process or transmission through computer systems. Monitors and displays that use analog video inputs are connected to digital-to-analog converters that reconstruct the original analog image signals.

The original frame transfer (FT) type CCD imaging devices required a mechanical shutter that would allow the analog charges to be shifted from photocell-to-photocell so the whole image could be clocked out into FIFO-registers. Otherwise, the light that was being received by each photocell would be converted to an analog electric signal that would be added to the one being clocked in from the upstream adjacent photocell. Such CCD devices were best suited for still camera work. The frame rates were basically limited by how fast all 491-lines could be clock out of the array before being spoiled by the next exposure.

A newer interline transfer (IT) type CCD solved the mechanical shutter problem. In the IT CCD, lines of storage cells are interdigitated amongst the active lines in the optical image area. Such lines of storage cells are only one clock pulse away from their individual corresponding active imaging lines, and each storage cell line is protected by a metal mask that keeps them permanently dark. So the active lines are simply clocked to their neighboring storage lines at the array's frame rate, e.g., during each vertical retrace period. The CCD array has until the next vertical retrace to clock out all 491 lines from the interdigitated storage cells.

Since the sensing and shifting functions are separated, each cell structure can be optimized for its particular use. However, some IT CCD imagers suffer from an artifact called vertical smear. Such occurs in pixels with extreme highlights because of the proximity of the sensing and storage elements. The light from extreme highlights actually leaks sideways into the adjacent storage register. The artifact appears as a vertical line that passes through the imaged highlight.

Every semiconductor technology used to fabricate a CCD imaging array will impose minimum exposure times on the active photocells and maximum clock rates on the storage cells. A typical CCD device, such as the Sony ICXO38DLA, Kodak KAI372, or Kodak KAI1001, has vertical registers that receive the image signals for each pixel on each line, and a horizontal register that receives each vertical register's output. The output of the horizontal register is a single line that carries the serial pixel-by-pixel frame representation. Therefore the frame rate is a function of the cell clocking rates, the frame's vertical depth, and the frame's horizontal width. For the Sony ICXO38DLA, that means 768-pixels on 484-lines.

A frame interline transfer (FIT) type CCD combines the best features of the older FT CCD imagers and the more recent IT CCD imagers. A top part of the FIT CCD operates like an IT CCD. But during the vertical interval, the image photocell charges are shifted from an interline storage register into a fully light-protected storage register below. So the charge packets are only held in an interline register for a very short time, and highlight contamination is substantially eliminated.

The prior art FIT structure offers the best overall performance available, but it is complex and needs larger chip real estates for the storage area. Such makes FIT CCD's significantly more expensive to manufacture.

Conventional commodity type CCD's are very inexpensive. They suit the NTSC types of applications where frame rates are relatively low, e.g., sixty frames-per-second. Special applications that require frame rates over one hundred frames-per-second have typically required special CCD integrated circuit designs and semiconductor technologies, and so involve low production numbers. The consequence has been very high manufacturing costs. There are many important CCD imaging applications that necessitate high frame rates, but the high cost of exotic parts cannot be justified.

SUMMARY OF THE INVENTION

It is therefore an object of the present invention to provide a CCD imaging device that can operate at frame rates over one hundred frames-per-second.

It is another object of the present invention to provide a CCD imaging device that is inexpensive to manufacture.

Briefly, a CCD imaging device embodiment of the present invention comprises modifying the optical mask of an otherwise ordinary and inexpensive CCD integrated circuit to darken a majority of the active imaging photocells. The CCD integrated circuit is operated at near its maximum horizontal and vertical clock rates, but multiple image frames are defined within the one previous active photocell array field. The added dark areas in the optical mask protect the recent frames still in transit within the active array area from being double exposed and thus corrupted. The serial output of the thus-modified CCD device is reinterpreted to include more frames than originally at a multiple equal to the original array dimension divided by the new array dimension $(m \cdot n/m' \cdot n')$. So a modified CCD array that used only one-fourth of the original active area could be operated at four times the original frame rate.

An advantage of the present invention is that a CCD imaging device is provided that can operate at frame rates over one hundred frames-per-second and is inexpensive to manufacture.

Another advantage of the present invention is that a CCD imaging device with a very fast frame rate is obtainable by a simple mask change in one of the semiconductor fabrication process steps of an otherwise ordinary and commodity type CCD imaging device.

These and other objects and advantages of the present invention will no doubt become obvious to those of ordinary skill in the art after having read the following detailed description of the preferred embodiments which are illustrated in the drawing figure.

IN THE DRAWINGS

FIG. 2 is an exploded assembly diagram that shows on the left the prior art normal inclusion of an optical blockage mask that uses most of the active photocells, on the right is shown the modified assembly and product of the present invention where an optical blockage mask is used that darkens most of the otherwise available active photocells;

FIG. 3 is a diagram that represents the prior art optical blockage mask normally included in conventional devices like the Kodak KAI1001, and shows that the top two rows and the bottom twelve rows of active photocells are blocked, as are the first three columns and the last forty columns;

Figure 5:
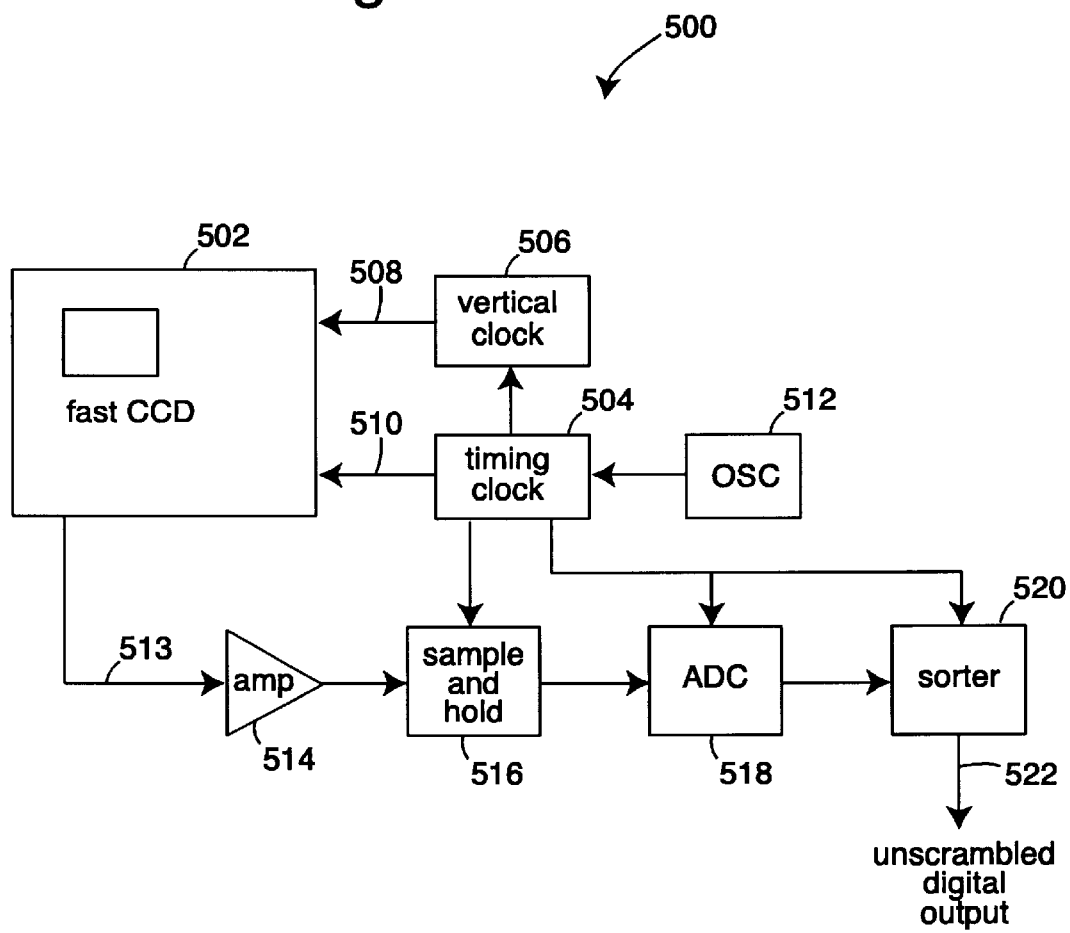

FIG. 4 is a diagram that represents an optical blockage mask of the present invention that would replace the one of FIGS. 2 and 3 in devices like the Kodak KAI1001, and shows that the top two rows and the bottom two hundred rows of active photocells are blocked, as are the first three columns and the last three hundred columns; and FIG. 5 is a functional block diagram that represents an application of a fast frame-rate CCD imaging device system embodiment of the present invention.

DETAILED DESCRIPTION OF THE PREFERRED EMBODIMENT

Figure 1:
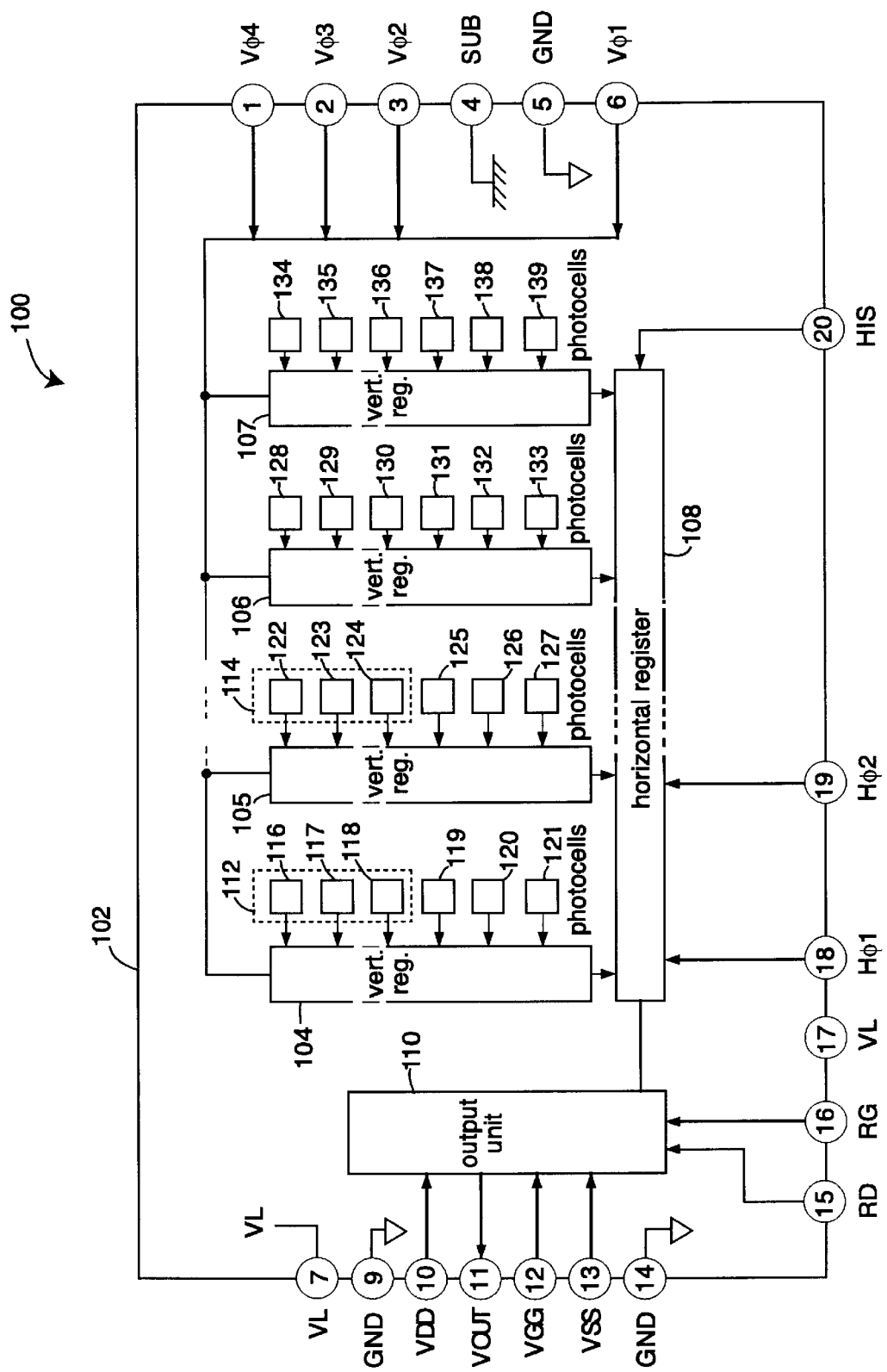
FIG. 1 is a functional block diagram of a fast frame-rate CCD imaging device embodiment of the present invention that has been implemented modifying a Kodak KAI1001.

A fast frame-rate CCD imaging device embodiment of the present invention is illustrated in FIG. 1 and is referred to herein by the general reference numeral 100. The system 100 includes an integrated circuit (IC) 102 on which is fabricated a plurality of vertical shift registers 104–107 connected to feed a horizontal shift register 108. In a typical CCD device like the Kodak KAI0372, there will be 811 vertical shift registers that are 508 pixels tall that build an array that is about 410K pixels. The effective pixel array of a Kodak KAI0372 is 768(H) by 494(V) for an array of about 380K pixels. An output unit 110 amplifies the serial output of the horizontal shift register 108 to produce a video output (Vout) on a package pin "11".

A pair of optical mask openings 112 and 114 represent an exposure of less than half of these 768(H) by 494(V) pixels in a Kodak KAI0372. Such has been modified in this example according to the present invention. Therefore, a group of active photo-sensitive photocells 116–121 have been parsed by mask opening 112 into still-exposed photocells 116–118 and newly covered photocells 119–121. Similarly, a group of active photo-sensitive photocells 122–127 have been divided by mask opening 114 into still-exposed photocells 122–124 and newly covered photocells 125–127. A group of remaining photocells 128–139 are all permanently darkened.

FIG. 1 is simplified to show only an array four wide (4H) by six high (6V) for a total active matrix area of twenty-four pixels. Actual device embodiments of the present invention will have arrays much larger than the simple one represented in FIG. 1. Optical mask openings 112 and 114 only allow two columns of pixels three pixels high to receive an image. So a new frame is defined herein to have a matrix area of six pixels, or one fourth the size of an array that would be possible if all photocells 116–139 could be exposed. But this six pixel array can be exposed at four times the rate than the larger twenty-four pixel can, given the same vertical and horizontal transfer clocking rates.

In operation, photocells 119–121 act as temporary storage for photocells 116–118. Similarly, photocells 125–127 act as temporary storage for photocells 122–124. Photocells 128–139 provide zero values that are clocked into horizontal register 108. Such zero values are overwritten by values provided by photocells 116–118 and 122–124 in subsequent frames.

In the following tables, the two vertical shift registers 104 and 105 that are connected in FIG. 1 to the unblocked photocells 116–118 and 122–124 are each represented as two columns six pixels high. The bottom row of twenty-four pixels represents the horizontal shift register 108. Each time the device 100 is clocked, the vertical shift registers move their photocell-captured information down one stage and the horizontal shift register moves such left one stage. The photocell-captured information that drops out the bottom of each vertical shift register is deposited into the cell immediately below in the horizontal shift register. The output of device 100 is taken from the left-most cell of the bottom row of twenty-four pixels.

Table I shows the starting condition where frame-1, consisting of a 2×3 array, is captured.

TABLE I

Frame-1 is captured

| | | | | | | | | | | | 1 | | | | | | | | | 1 |
|---|---|---|---|---|---|---|---|---|---|---|---|---|---|---|---|---|---|---|---|---|
| | | | | | | | | | | | 1 | | | | | | | | | 1 |
| | | | | | | | | | | | 1 | | | | | | | | | 1 |
| | | | | | | | | | | | x | | | | | | | | | x |
| | | | | | | | | | | | x | | | | | | | | | x |
| | | | | | | | | | | | x | | | | | | | | | x |

Table II shows the situation three clocks later where the frame-1 2×3 image has been shifted down into the cells darkened by the modified optical blockage mask of the present invention. This permits an electronic shutter to capture frame-2 in the 2×3 array represented by photocells 116–118 and 122–124.

TABLE II

Frame 1 is Shifted, Frame-2 is Captured

|   |   |   |   |   |   |   |   |   |   |   |   |   |   |   |   |   |   |   |   |
|---|---|---|---|---|---|---|---|---|---|---|---|---|---|---|---|---|---|---|---|
|   |   |   |   |   |   |   |   | 2 |   |   |   |   |   |   |   | 2 |   |   |   |
|   |   |   |   |   |   |   |   | 2 |   |   |   |   |   |   |   | 2 |   |   |   |
|   |   |   |   |   |   |   |   | 2 |   |   |   |   |   |   |   | 2 |   |   |   |
|   |   |   |   |   |   |   |   | 1 |   |   |   |   |   |   |   | 1 |   |   |   |
|   |   |   |   |   |   |   |   | 1 |   |   |   |   |   |   |   | 1 |   |   |   |
|   |   |   |   |   |   |   |   | 1 |   |   |   |   |   |   |   | 1 |   |   |   |
|   |   |   |   |   |   |   |   |   |   |   |   |   |   |   |   |   |   |   |   |

Table III shows the situation another three clocks later where the frame-1 2×3 image has been shifted down into the horizontal shift register and shifted left. The frame-2 2×3 image now resides in the cells darkened by the modified optical blockage mask of the present invention. The electronic shutter can then capture frame-3 in the 2×3 array represented by photocells 116–118 and 122–124.

TABLE III

Frames-1,2 are Shifted, Frame-3 is Captured

|   |   |   |   |   |   |   |   |   |   |   |   |   |   |   |   |   |   |   |   |
|---|---|---|---|---|---|---|---|---|---|---|---|---|---|---|---|---|---|---|---|
|   |   |   |   |   |   |   |   | 3 |   |   |   |   |   |   |   | 3 |   |   |   |
|   |   |   |   |   |   |   |   | 3 |   |   |   |   |   |   |   | 3 |   |   |   |
|   |   |   |   |   |   |   |   | 3 |   |   |   |   |   |   |   | 3 |   |   |   |
|   |   |   |   |   |   |   |   | 2 |   |   |   |   |   |   |   | 2 |   |   |   |
|   |   |   |   |   |   |   |   | 2 |   |   |   |   |   |   |   | 2 |   |   |   |
|   |   |   |   |   |   |   |   | 2 |   |   |   |   |   |   |   | x |   |   |   |
|   |   |   |   |   |   | 1 | 1 | 1 |   |   |   |   |   |   |   | 1 | 1 | 1 |   |

Table IV shows the situation another three clocks later where the frame-1 2×3 image has been shifted left another three cells and frame-2 has been shifted down from the vertical shift registers and then left in the horizontal shift register. The frame-3 2×3 image now resides in the cells darkened by the modified optical blockage mask of the present invention. The electronic shutter can then capture frame-4 in the 2×3 array represented by photocells 116–118 and 122–124.

TABLE IV

Frames 1–3 are Shifted, Frame-4 is Captured

|   |   |   |   |   |   |   |   |   |   |   |   |   |   |   |   |   |   |   |   |   |   |   |
|---|---|---|---|---|---|---|---|---|---|---|---|---|---|---|---|---|---|---|---|---|---|---|
|   |   |   |   |   |   |   |   |   |   | 4 |   |   |   |   |   |   |   |   |   | 4 |   |   |
|   |   |   |   |   |   |   |   |   |   | 4 |   |   |   |   |   |   |   |   |   | 4 |   |   |
|   |   |   |   |   |   |   |   |   |   | 4 |   |   |   |   |   |   |   |   |   | 4 |   |   |
|   |   |   |   |   |   |   |   |   |   | 3 |   |   |   |   |   |   |   |   |   | 3 |   |   |
|   |   |   |   |   |   |   |   |   |   | 3 |   |   |   |   |   |   |   |   |   | 3 |   |   |
|   |   |   |   |   |   |   |   |   |   | 3 |   |   |   |   |   |   |   |   |   | 3 |   |   |
|   |   |   |   |   | 1 | 1 | 1 | 2 | 2 | 2 |   |   |   |   |   | 1 | 1 | 1 | 2 | 2 | 2 |   |

Table V shows the situation three more clocks later where the frame 1 and 2 images have been shifted left another three cells and frame-3 has been shifted down from the vertical shift registers and then left in the horizontal shift register. the frame-4 2×3 image now resides in the cells darkened by the modified optical blockage mask of the present invention. The electronic shutter can then capture frame-5 in the 23×3 array represented by photocells 116–118 and 122–124.

TABLE V

Frames 1–4 are Shifted, Frame-5 is Captured

| | | | | | | | 5 | | | | | | | | | 5 |
|---|---|---|---|---|---|---|---|---|---|---|---|---|---|---|---|---|
| | | | | | | | 5 | | | | | | | | | 5 |
| | | | | | | | 5 | | | | | | | | | 5 |
| | | | | | | | 4 | | | | | | | | | 4 |
| | | | | | | | 4 | | | | | | | | | 4 |
| | | | | | | | 4 | | | | | | | | | 4 |
| | | 1 | 1 | 1 | 2 | 2 | 2 | 3 | 3 | 3 | | | 1 | 1 | 1 | 2 | 2 | 2 | 3 | 3 | 3 |

Table VI shows the situation three more clocks later where the frame 1–3 images have been shifted left another three cells and frame-4 has been shifted down from the vertical shift registers and then left in the horizontal shift register. The frame-5 2×3 image now resides in the cells darkened by the modified optical blockage mask of the present invention. The electronic shutter can then capture frame-6 in the 2×3 array represented by photocells 116–118 and 122–124. The very first output from the device will occur on the next clock cycle from the left-most cell of the horizontal shift register. It should be clear from the contents of the horizontal shift register represented in Table VI that some sorting will be required to undo the mixture of frames 1–4 that has occurred. In an unmodified CCD device, the horizontal shift register at this point would contain only one frame of information, not four frames. So this is how the embodiments of the present invention are able to multiply the frame rate of an otherwise ordinary CCD device, albeit at reduced resolution.

TABLE VI

Frames 1–5 are Shifted, Frame-6 is Captured

| | | | | | | | 6 | | | | | | | | | 6 |
|---|---|---|---|---|---|---|---|---|---|---|---|---|---|---|---|---|
| | | | | | | | 6 | | | | | | | | | 6 |
| | | | | | | | 6 | | | | | | | | | 6 |
| | | | | | | | 5 | | | | | | | | | 5 |
| | | | | | | | 5 | | | | | | | | | 5 |
| | | | | | | | 5 | | | | | | | | | 5 |
| 1 | 1 | 1 | 2 | 2 | 2 | 3 | 3 | 3 | 4 | 4 | 4 | 1 | 1 | 1 | 2 | 2 | 2 | 3 | 3 | 3 | 4 | 4 | 4 |

FIG. 2 illustrates a prior art device 200 and a modified device 204 that differ by only one semiconductor fabrication process step. Both use a DIP-package 206. In the prior art device 200 a semiconductor chip 210 receives an optical mask 208 with a large aperture. The modified device 204 receives the exact same semiconductor chip 214, but has a different optical mask 212 with a much smaller aperture. Mask 208 creates an imaging area 216 that uses a majority of the CCD photocells arrayed within the chip 210. Mask 212 creates an imaging area 218 that uses a minority of the CCD photocells arrayed within the chip 210. A frame-rate multiplication during use is made possible by clocking the photocell image information from the unblocked CCD imaging photocells in area 218 into the permanently darkened CCD imaging photocells when a next image frame exposure occurs. The optical mask 212 may be implemented with aluminum that is deposited during a metal mask step in the otherwise normal semiconductor chip fabrication.

FIG. 3 represents a prior art optical blockage mask 300 that is normally included in conventional devices like the Kodak KAI0372. A large aperture 302 allows all but the top two rows and the bottom twelve rows of active photocells are blocked, as are the first three columns and the last forty columns.

FIG. 4 is a diagram that represents an optical blockage mask of the present invention that would replace the one of FIGS. 2 and 3 in devices like the Kodak KAI0372. An aperture 402 allows all but the top two rows and the bottom two hundred rows of active photocells to receive optical images. Similarly, all but the first three columns and the last three hundred columns are not permanently darkened.

FIG. 5 represents an application of a fast frame-rate CCD imaging device system embodiment of the present invention, and is referred to herein by the general reference numeral 500. A fast frame-rate CCD imaging device 502 is connected to a horizontal rate timing clock 504 and a vertical rate timing clock 506. A vertical sync signal 508 and a horizontal sync signal 510 are both derived from a system oscillator 512. An output signal 513 contains a serially scrambled mixture of more than one image frame. A buffer 514 amplifies the signal for a sample and hold unit 516. An analog-to-digital converter (ADC) 518 produces a binary digital word equivalent of the analog image signals captured by the CCD 502. A sorter 520 writes a digital memory array with the digitized image signals as they are received. It then sorts them into corresponding frames for an organized frame-by-frame output signal 522. Sorter 520 is described here as a digital device, but an analog sorter based on CCD memory technology could alternatively be substituted in front of the ADC 518.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A fast frame-rate CCD imaging device, comprising:

a semiconductor chip;

an m-by-n array of CCD imaging photocells fabricated in the semiconductor chip;

an m-number of vertical shift registers connected to a corresponding column of the CCD imaging photocells;

a horizontal shift register connected to receive photocell information from the vertical shift registers; and an optical blockage mask deposited on the semiconductor chip and over the m-by-n array of CCD imaging photocells such that a majority of such CCD imaging photocells are permanently darkened;

wherein, a frame-rate multiplication during use is made possible by a clocking of photocell image information from a first plurality of unblocked CCD imaging photocells into a second plurality of permanently darkened CCD imaging photocells when a next image frame exposure occurs.

2. The device of claim 1, further comprising:

a sorter connected to receive and unscramble a mixture of image frame information that is output from said horizontal shift register.

3. The device of claim 1, wherein:

the optical blockage mask is aluminum metal deposited as a metal mask during a semiconductor device fabrication process step.

4. The device of claim 1, wherein:

the horizontal shift register outputs a serially scrambled mixture of more than one image frame.

5. A method for converting a first CCD imaging device with a first maximum frame-rate capability to a second CCD imaging device with a second, much higher maximum frame-rate capability, the method comprising the steps of:

fabricating m-by-n array of CCD imaging photocells fabricated in the semiconductor chip;

substituting a first optical blockage mask for said first CCD imaging device with a second optical blockage mask for said first CCD imaging device, wherein said second optical blockage mask has an aperture substantially smaller than said first optical blockage mask; and depositing said second optical blockage mask on said semiconductor chip over said m-by-n array of CCD imaging photocells such that a majority of such CCD imaging photocells are permanently darkened;

wherein, a frame-rate multiplication during use is made possible by a clocking of photocell image information from a first plurality of unblocked CCD imaging photocells into a second plurality of permanently darkened CCD imaging photocells when a next image frame exposure occurs.

6. The method of claim 5, wherein the step of depositing said optical blockage mask includes using aluminum metal in a metal-mask semiconductor device processing step.

* * * * *